(12) United States Patent
Cho et al.

(10) Patent No.: US 8,389,593 B2
(45) Date of Patent: *Mar. 5, 2013

(54) COMPOSITION FOR SIMULTANEOUSLY FORMING TWO ISOLATED COLUMN SPACER PATTERNS

(75) Inventors: Chang Ho Cho, Anseong-si (KR); Keon Woo Lee, Daejeon (KR); Sung Hyun Kim, Daejeon (KR); Sang Kyu Kwak, Daejeon (KR); Dong Kung Oh, Daejeon (KR); Chang Soon Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 261 days.

This patent is subject to a terminal disclaimer.

(21) Appl. No.: 12/654,583

(22) Filed: Dec. 23, 2009

(65) Prior Publication Data

US 2010/0160477 A1  Jun. 24, 2010

(30) Foreign Application Priority Data

Dec. 24, 2008 (KR) .......... 10-2008-0133739
Dec. 8, 2009 (KR) .......... 10-2009-0121019

(51) Int. Cl.
*B29C 71/04* (2006.01)
*A61L 2/08* (2006.01)
*G03F 7/00* (2006.01)

(52) U.S. Cl. ......... 522/78; 522/79; 522/121; 430/281.1; 430/286.1

(58) Field of Classification Search ............... 522/78, 522/79, 121; 430/281.1, 286.1
See application file for complete search history.

(56) References Cited

U.S. PATENT DOCUMENTS

| 7,554,636 B2 * | 6/2009 | Nakatsugawa ............... 349/118 |
| 7,556,910 B2 * | 7/2009 | Kim et al. ................... 430/270.1 |
| 2005/0185129 A1 | 8/2005 | Kim et al. |
| 2009/0128767 A1 * | 5/2009 | Suezaki et al. ............... 349/155 |
| 2010/0081089 A1 * | 4/2010 | Kim et al. .................. 430/286.1 |
| 2010/0105793 A1 * | 4/2010 | Lee et al. ..................... 522/39 |
| 2010/0112479 A1 * | 5/2010 | Lee et al. .................. 430/285.1 |

FOREIGN PATENT DOCUMENTS

| JP | 2003-029393 | 1/2003 |
| JP | 2005-242309 | 9/2005 |
| JP | 2008-145986 | 6/2008 |
| JP | 2008-197494 | 8/2008 |
| KR | 10-2008-0026119 | 3/2008 |

* cited by examiner

*Primary Examiner* — Nathan M Nutter
(74) *Attorney, Agent, or Firm* — McKenna Long & Aldridge LLP

(57) ABSTRACT

A composition for forming column spacers is provided. The composition comprises a radical polymerization inhibitor. The use of the composition enables simultaneous formation of a saturated pattern and a semi-transmissive pattern as column spacer patterns having different shapes, whose difference in thickness is controllable as desired although the sensitivity is slightly reduced, through a slit or semi-transmissive mask by varying the kind and amount of the radical polymerization inhibitor. Further provided are column spacers formed using composition and a liquid crystal display using the column spacers.

11 Claims, No Drawings

COMPOSITION FOR SIMULTANEOUSLY FORMING TWO ISOLATED COLUMN SPACER PATTERNS

This application claims the benefit of Korean Patent application No. 10-2008-0133739, filed Dec. 24, 2008 and Korean Patent application No. 10-2009-0121019, filed Dec. 8, 2009, both of which are hereby incorporated herein by reference for all purposes in their entireties.

BACKGROUND OF THE INVENTION

1. Field of the Invention

The present invention relates to a composition comprising a radical polymerization inhibitor whose kind and content vary to simultaneously form two column spacers having different shapes through a slit or semi-transmissive mask. The present invention also relates to column spacers formed using composition and a liquid crystal display comprising the column spacers.

2. Description of the Related Art

A liquid crystal cell of a liquid crystal display essentially includes a thin film transistor (TFT) substrate for driving the liquid crystal display, a color filter substrate for color display, and a liquid crystal filled between the two substrates. The color filter substrate is produced by subjecting a photosensitive organic material, in which at least one pigment is dispersed, to photolithography to form a pattern and coating three or more kinds of color inks having different transmission-absorption wavelengths on the pattern to form pixels. The pixels are combined to create color images. If needed, overcoats are formed in the color filter substrate to reduce the step between the adjacent pixels, or column spacers are formed by patterning to maintain the inner gap of the liquid crystal cell at a constant level.

Photosensitive resin compositions, particularly, negative type photosensitive resin compositions patternable by photolithography are usually used to form the overcoats or the column spacers. A typical negative type photosensitive resin composition essentially comprises an alkali-soluble polymer, a polyfunctional monomer having two or more acrylate groups, and a photoinitiator. Optionally, the negative type photosensitive resin composition may further comprise a solvent, a surfactant, an adhesion aid, etc.

The photoinitiator is decomposed to generate active radicals when the negative type photosensitive resin composition is exposed to light, particularly UV light. The active radicals activate the acrylate groups of the polyfunctional monomer to induce cross-linking of the alkali-soluble polymer with the polyfunctional monomer (photopolymerization). This photopolymerization increases the molecular weight of the polymer in the cross-linked portion (i.e. in the portion exposed to light), and as a result, the exposed portion becomes insoluble in alkali. The exposed portion remains unremoved even after subsequent development. Consequently, the use of the negative type photosensitive resin enables the formation of a fine pattern by photolithography.

The sensitivity of a photosensitive resin composition is associated with the minimum exposure dose (i.e. light energy) at which a pattern is stably formed. A low exposure dose shortens the processing time to assist in productivity improvement. Particularly, the sensitivity of a photosensitive resin composition for forming column spacers to maintain the gap of a liquid crystal cell at a constant level is determined as an exposure dose at which the variation in the thickness of patterns is sharply decreased.

Photoinitiators that rapidly respond to low light energy have been used to improve the sensitivity of photosensitive resin compositions without any marked reduction in the developability of the photosensitive resin compositions. However, the use of photoinitiators for improving the sensitivity of photosensitive resin compositions is disadvantageous in that the variation in the thickness of patterns depending on the exposure dose is small. This disadvantage makes it difficult to form transparent thin films whose thickness is controlled by varying the slit structure and transmittance of photomasks.

Radical polymerization inhibitors are often added to negative type photosensitive resin compositions. The radical polymerization inhibitors may be added separately. In most case, the radical polymerization inhibitors are present in small amounts in other raw materials, such as binder resins, cross-linking agents and solvents.

Radical polymerization inhibitors have been used for the purpose of improving the storage stability (stability over time) of photosensitive resin compositions because of their ability to remove a small amount of radicals created during storage of the photosensitive resin compositions.

A conventional negative type photosensitive resin composition enables the formation of column spacer patterns having the same shape, but it has difficulty in simultaneously forming a saturated pattern and a semi-transmissive pattern as column spacer patterns having different shapes for use in a liquid crystal display through a slit or semi-transmissive mask.

Thus, there is an urgent need to develop a composition for simultaneously forming a saturated pattern and a semi-transmissive pattern as column spacer patterns having different shapes, whose difference in thickness is controllable as desired although the sensitivity is slightly reduced, for use in a liquid crystal display through a slit or semi-transmissive mask.

SUMMARY OF THE INVENTION

An object of the present invention is to provide a photosensitive resin composition for simultaneously forming two isolated column spacer patterns having different shapes through a slit or semi-transmissive mask.

Another object of the present invention is to provide column spacers formed using the resin composition.

Still another object of the present invention is to provide a liquid crystal display using the column spacers.

The present inventors have conductive intensive studies in order to solve the problems of the prior art, and as a result, have discovered that a semi-transmissive pattern and a saturated pattern as column spacer patterns having different shapes can be formed simultaneously from a composition comprising a radical polymerization inhibitor, which has been used only in terms of sensitivity and storage stability, through a slit or semi-transmissive mask by varying the kind and content of the radical polymerization inhibitor, and that the semi-transmissive pattern is thinner than the saturated pattern because the semi-transmissive pattern receives a smaller amount of light and is less cured by the radical polymerization inhibitor than the saturated pattern, so that the size of the semi-transmissive pattern can be controlled as desired without changes in the sensitivity and size of the saturated pattern. The present invention has been achieved based on this discovery.

According to the present invention, there is provided a photosensitive resin composition for simultaneously forming two isolated column spacer patterns which comprises at least one radical polymerization inhibitor selected from the group consisting of compounds having two or more phenolic hydroxyl groups, compounds having at least one aromatic ring substituted with at least one imino group, cyclic compounds partially substituted with at least one imino group, and hindered amine compounds.

DETAILED DESCRIPTION OF THE INVENTION

Exemplary embodiments of the present invention will now be described in more detail.

The present invention provides a photosensitive resin composition for simultaneously forming two isolated column spacer patterns which comprises 1 to 20% by weight of an alkali-soluble resin, 1 to 20% by weight of an ethylenically unsaturated compound, 0.05 to 10% by weight of a photoinitiator, 0.0001 to 5% by weight of a radical polymerization inhibitor, and 50 to 95% by weight of a solvent.

The radical polymerization inhibitor plays a role in inactivating polymerization-initiating radicals generated from the photoinitiator to inhibit the radical polymerization due to its hydrogen-donating or hydrogen-withdrawing, energy-donating or energy-withdrawing, or electron-donating or electron-withdrawing ability.

The radical polymerization inhibitor is preferably selected from the group consisting of compounds having two or more phenolic hydroxyl groups, compounds having at least one aromatic ring substituted with at least one imino group, cyclic compounds partially substituted with at least one imino group, hindered amine compounds, and mixtures thereof. More specifically, the radical polymerization inhibitor is selected from the group consisting of monomethyl ether hydroquinone (MEHQ), bis-(1-octyloxy-2,2,6,6-tetramethyl-4-piperidinyl)sebacate (TINUVIN 123), 1-(methyl)-8-(1,2,2,6,6-pentamethyl-4-piperidinyl)sebacate (TINUVIN 292), aluminum-nitrosophenylhydroxylamine (Q1301), butylated hydroxytoluene (BHT), phenothiazine, hydroquinone, methoxyquinone, 1,4-phenylenediamine, derivatives thereof, and mixtures thereof.

The two isolated patterns as used herein refer to a saturated pattern and a semi-transmissive pattern. The saturated pattern is formed through a photomask having a circular isolated pattern (transmittance=100%, diameter=15 μm). The semi-transmissive pattern is formed through a photomask having a circular isolated pattern (diameter=35 μm) whose transmittance is adjusted to 10% using a chromium-deposited thin film. The two isolated patterns are formed by exposing the photosensitive resin composition of the present invention under a high-pressure mercury lamp with varying exposure doses from 10 to 500 mJ/cm$^2$ through the respective photomasks.

The influence of the polymerization inhibitor on the polymerization in the saturated pattern is relatively small because the saturated pattern receives a sufficient exposure dose of light. In contrast, the polymerization does not sufficiently proceed by the radical polymerization inhibitor in the semi-transmissive pattern because the semi-transmissive pattern has a much smaller area where light is irradiated than the saturated pattern. As a result, the semi-transmissive pattern is smaller in size and thickness than the saturated pattern.

That is, an increased amount of the radical polymerization inhibitor reduces the thickness of the semi-transmissive pattern. Accordingly, the step between the semi-transmissive pattern and the saturated pattern can be controlled as desired by varying the amount of the radical polymerization inhibitor in the photosensitive resin composition. Further, a stronger inhibitory effect of the polymerization inhibitor on the radical polymerization makes the semi-transmissive pattern smaller in size despite the addition of the polymerization inhibitor in the same amount, leading to an increased step between the two isolated patterns. Therefore, a desired size of the semi-transmissive pattern can be obtained without changes in the sensitivity and size of the saturated pattern by varying the kind and content of the radical polymerization inhibitor.

The content of the radical polymerization inhibitor is preferably from 0.0001 to 5% by weight, more preferably 0.001 to 0.4% by weight, and most preferably 0.005 to 0.1% by weight, based on the total weight of the photosensitive resin composition. If the content of the radical polymerization inhibitor is less than 0.0001% by weight, the resolution of the pattern-forming material may be degraded. Meanwhile, if the content of the radical polymerization inhibitor exceeds 5% by weight, the sensitivity of the pattern-forming material to actinic radiation may be insufficient.

The alkali-soluble resin of the photosensitive resin composition according to the present invention refers to a polymeric resin that contains carboxylic groups and is soluble in alkali. Specifically, the alkali-soluble resin may be a copolymer of a monomer having at least one acid functional group and a monomer copolymerizable therewith and capable of making a final film strong, or a polymeric compound of the copolymer and an ethylenically unsaturated compound containing at least one epoxy group.

The alkali-soluble resin has an acid value of about 30 to about 300 KOH mg/g. The alkali-soluble resin preferably has a weight average molecular weight ranging from 1,000 to 200,000 and more preferably from 5,000 to 100,000.

The monomer having at least one acid functional group is preferably selected from the group consisting of, but not limited to, (meth)acrylic acid, crotonic acid, itaconic acid, maleic acid, fumaric acid, monomethyl maleic acid, isoprene sulfonic acid, styrene sulfonic acid, 5-norbornene-2-carboxylic acid, mono-2-((meth)acryloyloxy)ethyl phthalate, mono-2-((meth)acryloyloxy)ethyl succinate, ω-carboxypolycaprolactone mono(meth)acrylate, and mixture thereof.

The monomer copolymerizable with the monomer having at least one acid functional group is selected from the group consisting of, but not limited to: unsaturated carboxylic acid esters, such as benzyl (meth)acrylate, methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, isobornyl (meth)acrylate, ethylhexyl acrylate, 2-phenoxyethyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, acyloctyloxy-2-hydroxypropyl (meth)acrylate, glycerol (meth)acrylate, 2-methoxyethyl (meth)acrylate, 3-methoxybutyl (meth)acrylate, ethoxydiethylene glycol (meth)acrylate, methoxytriethylene glycol (meth)acrylate, methoxytripropylene glycol (meth)acrylate, poly(ethylene glycol) methyl ether (meth)acrylate, phenoxydiethylene glycol (meth)acrylate, p-nonylphenoxypolyethylene glycol (meth)acrylate, p-nonylphenoxypolypropylene glycol(meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, methyl α-hydroxymethyl acrylate, ethyl α-hydroxymethyl acrylate, propyl α-hydroxymethyl acrylate, butyl α-hydroxymethyl acrylate, dicyclopentanyl (meth)acrylate, dicyclopentenyl (meth)acrylate, dicyclopentanyl oxyethyl (meth)acrylate, and dicyclopentenyl oxyethyl (meth)acrylate; vinyl aromatic monomers, such as styrene, α-methylstyrene, o-, m- and p-vinyltoluenes, o-, m- and p-methoxystyrenes, and o-, m- and p-chlorostyrenes; unsaturated ethers, such as vinyl methyl ether, vinyl ethyl ether, and allyl glycidyl ether; N-vinyl tertiary amines, such as N-vinyl pyrrolidone, N-vinyl carbazole, and N-vinyl morpholine; unsaturated imides, such as N-phenylmaleimide, N-(4-chlorophenyl)maleimide, N-(4-hydroxyphenyl)maleimide, and N-cyclohexylmaleimide; maleic anhydrides, such as maleic anhydride and methyl maleic anhydride; unsaturated glycidyl compounds, such as allyl glycidyl ether, glycidyl (meth)acrylate, and 3,4-epoxycyclohexylmethyl (meth)acrylate; and mixtures thereof.

The ethylenically unsaturated compound containing at least one epoxy group can be selected from the group consisting of allyl glycidyl ether, glycidyl (meth)acrylate, 3,4-epoxycyclohexylmethyl (meth)acrylate, glycidyl 5-norbornene-2-methyl-2-carboxylate (mixture of endo- and exo-isomers), 1,2-epoxy-5-hexene, 1,2-epoxy-9-decene, and mixtures thereof.

The content of the alkali-soluble resin is preferably from 1 to 20% by weight, based on the total weight of the photosensitive resin composition. If the content of the alkali-soluble resin is less than 1% by weight, it is difficult to form patterns because the photosensitive resin composition is not sufficiently dissolved in a developing solution. Meanwhile, if the content of the alkali-soluble resin exceeds 20% by weight, the photosensitive resin composition in the form of a solution is too viscous, making it difficult to coat.

Any ethylenically unsaturated compound known in the art may be used in the photosensitive resin composition of the present invention so long as the objects of the present invention are not impaired. Representative examples of such ethylenically unsaturated compounds are the compounds of Formulas 1 to 4:

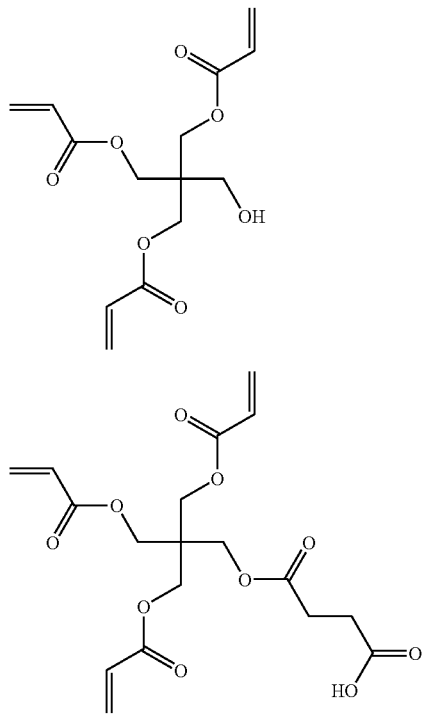

(1)

(2)

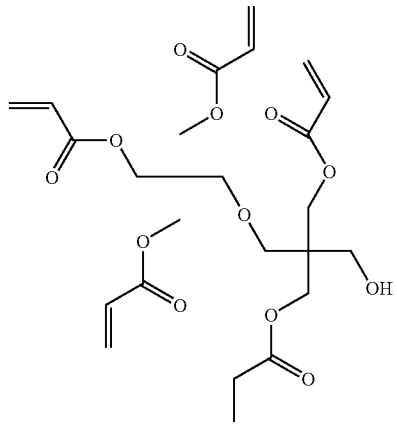

(3)

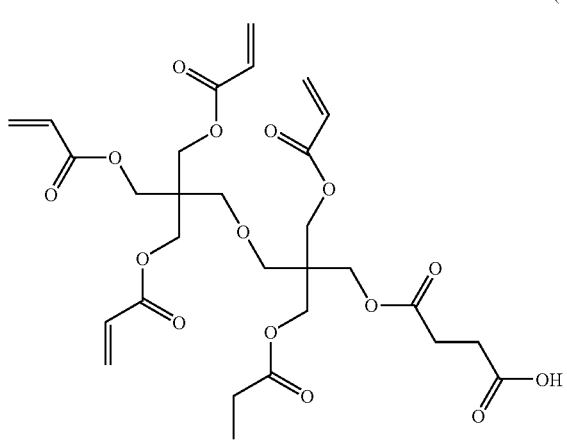

(4)

In addition to the elthylenically unsaturated compounds of Formulas 1 to 4, specific examples of ethylenically unsaturated compounds that can be used in the photosensitive resin composition of the present invention include: compounds introduced into dipentaerythritol, such as KAYARAD DPCA-20, KAYARAD DPCA-30, KAYARAD DPCA-60 and KAYARAD DPCA-120; compounds introduced into tetrahydrofurfuryl acrylate, such as KAYARAD TC-110S; and compounds introduced into neopentyl glycol hydroxypivalate, such as KAYARAD HX-220 and KAYARAD HK-620. The ethylenically unsaturated compound may be a functional monomer having one or more ethylenically unsaturated bonds. Examples of such functional monomers include epoxy acrylates of bisphenol A derivatives, novolac-epoxy acrylates, and urethane-based polyfunctional acrylates, such as U-324A, U15HA and U-4HA. These functional monomers may be used alone or as a mixture of two or more thereof.

The ethylenically unsaturated compound is preferably used in an amount of 1 to 20% by weight, based on the total weight of the photosensitive resin composition. The use of the ethylenically unsaturated compound in an amount of less than 1% by weight does not ensure satisfactory photo-crosslinking. Meanwhile, the use of the ethylenically unsaturated compound in an amount exceeding 20% by weight makes the photosensitive resin composition less soluble in alkali, which causes difficulty in forming patterns.

The solvent is selected from the group consisting of, but not limited to, methyl ethyl ketone, methyl cellosolve, ethyl cellosolve, propyl cellosolve, ethylene glycol dimethyl ether, ethylene glycol diethyl ether, ethylene glycol methyl ethyl ether, propylene glycol dimethyl ether, propylene glycol diethyl ether, propylene glycol methyl ethyl ether, 2-ethoxypropanol, 2-methoxypropanol, 3-methoxybutanol, cyclopentanone, cyclohexanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, methyl 3-methoxypropionate, and dipropylene glycol monomethyl ether. Other solvents known in the art may also be used in the present invention.

Optionally, the photosensitive resin composition of the present invention may further comprise at least one additive selected from a curing accelerator, a plasticizer, an adhesion promoter, a filler and a surfactant.

The curing accelerator is selected from the group consisting of 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, and mixtures thereof.

The photosensitive resin composition of the present invention can be applied to a suitable support by any suitable process, such as roll coating, curtain coating, spin coating, slot die coating, printing or dipping. The support may be a metal, paper, glass or plastic substrate. The coating on the support may be directly transferred to another support. Alternatively, the coating on the support may be indirectly transferred to another support via a blanket. There is no particular limitation on the application method of the photosensitive resin composition.

The photosensitive resin composition of the present invention can be cured under a suitable light source known in the art, for example, a mercury vapor, carbon, xenon or halogen arc that emits light having a wavelength of 250 to 450 nm. There is no particular limitation on the kind of the light source.

The photosensitive resin composition of the present invention is subjected to a series of exposure and development to form patterns. The exposure and development can be performed without any particular limitation by methods commonly known in the art.

The photosensitive resin composition of the present invention can be formed into two isolated patterns, i.e. a saturated pattern and a semi-transmissive pattern, through a series of exposure and development. The patterns feature that the difference in thickness between the patterns can be maintained to some extent to allow for use as column spacers.

The semi-transmissive pattern may be formed through a half-tone mask including a light-transmitting portion, a semi-transmissive portion and a light-blocking portion.

The semi-transmissive portion of the half-tone mask has an average transmittance of 4 to 25% at 300 to 450 nm.

The ratio of the thickness of the semi-transmissive pattern to the thickness of the saturated pattern is preferably 0.3~0.9, more preferably 0.5~0.9, and most preferably 0.6~0.85.

If there is no significant difference in thickness between the saturated pattern and the semi-transmissive pattern, it is meaningless to simultaneously form the two isolated patterns. Meanwhile, if there is such a large difference in thickness between the saturated pattern and the semi-transmissive pattern, the semi-transmissive pattern cannot perform its function to prevent light leakage when being pressed.

The two column spacer patterns formed using the photosensitive resin composition of the invention can be suitably used in liquid crystal displays.

Hereinafter, the present invention will be explained in more detail with reference to the following examples. However, these examples are provided for illustrative purposes only and are not intended to limit the scope of the invention.

EXAMPLES

Example 1

8 Parts by weight of BzMA/MAA (molar ratio=70/30, $M_w$=24,000) as an alkali-soluble resin, 16 parts by weight of dipentaerythritol hexaacrylate as an ethylenically unsaturated compound, 1 part by weight of 2-benzyl-2-dimethylamino-1-(4-morpholinophenyl)-butan-1-one (Irgacure 369, Ciba Geigy) as a photoinitiator, 0.005 parts by weight of MEHQ as a radical polymerization inhibitor, and 74.995 parts by weight of PGMEA as an organic solvent were mixed using a shaker for 3 hr to prepare a photosensitive resin composition for forming column spacers. The photosensitive resin composition in the form of a solution was filtered through a filter (size=5 microns), applied to glass by spin coating, and prebaked at 100° C. for 2 min to form a uniform film having a thickness of about 3.8 μm. The film was exposed under a high-pressure mercury lamp with varying exposure doses from 10 to 500 mJ/cm² through two different patterned photomasks. The photomasks were a first photomask having a circular isolated pattern (transmittance=100%, diameter=15 μm) and a second photomask having a circular isolated pattern (diameter: 35 μm) whose transmittance was adjusted to 10% using a chromium-deposited thin film. The exposed film was developed with an alkaline aqueous KOH solution (pH 11.3-11.7), washed with deionized water, and post-baked at 200° C. for about 50 min to form spacer patterns.

Example 2

Spacer patterns were formed in the same manner as in Example 1, except that 0.05 parts by weight of MEHQ as a radical polymerization inhibitor and 74.95 parts by weight of PGMEA as an organic solvent were used.

Example 3

Spacer patterns were formed in the same manner as in Example 1, except that 0.05 parts by weight of TINUVIN 292 (Ciba Geigy) as a radical polymerization inhibitor and 74.95 parts by weight of PGMEA as an organic solvent were used.

Example 4

Spacer patterns were formed in the same manner as in Example 1, except that 0.5 parts by weight of TINUVIN 292 (Ciba Geigy) as a radical polymerization inhibitor and 74.5 parts by weight of PGMEA as an organic solvent were used.

Example 5

Spacer patterns were formed in the same manner as in Example 1, except that 0.05 parts by weight of butylated hydroxytoluene (BHT) as a radical polymerization inhibitor and 74.95 parts by weight of PGMEA as an organic solvent were used.

Example 6

Spacer patterns were formed in the same manner as in Example 1, except that 0.05 parts by weight of 1,4-phenylenediamine as a radical polymerization inhibitor and 74.95 parts by weight of PGMEA as an organic solvent were used.

Example 7

Spacer patterns were formed in the same manner as in Example 1, except that 0.05 parts by weight of TINUVIN 123 (Ciba Geigy) as a radical polymerization inhibitor and 74.95 parts by weight of PGMEA as an organic solvent were used.

Example 8

Spacer patterns were formed in the same manner as in Example 1, except that 0.05 parts by weight of Q1301 (Wako Pure Chemical) as a radical polymerization inhibitor and 74.95 parts by weight of PGMEA as an organic solvent were used.

Comparative Example 1

Spacer patterns were formed in the same manner as in Example 1, except that the radical polymerization inhibitor was not used. Also, the content of PGMEA as an organic solvent was 75 parts by weight.

Experimental Example 1

The thickness of each of the patterns formed in Examples 1-8 and Comparative Example 1 was measured. The sensitivity of each of the photosensitive resin compositions prepared in Examples 1-8 and Comparative Example 1 was determined as the exposure dose at which the thickness of the pattern was not increased any further. A low exposure dose means that the pattern was stably formed at low light energy, which can be considered excellent in terms of pattern formation. Each of the photosensitive resin compositions was irradiated with light at an exposure dose of 100 mJ/cm$^2$ through a photomask having a saturated pattern (transmittance=100%) and a chromium-deposited semi-transmissive pattern (transmittance=10%) to form patterns. The difference in thickness between the patterns was calculated. The results are shown in Table 1.

As can be seen from the results in Table 1, in comparison with the spacer patterns formed in Comparative Example 1 comprising no radical polymerization inhibitor, the saturated pattern of each of the spacer patterns formed in Examples 1-8, which comprises at least one radical polymerization inhibitor, was slightly reduced in sensitivity and thickness and the semi-transmissive pattern thereof was greatly reduced in thickness, leading to a large difference in thickness (step) between the saturated pattern and the semi-transmissive pattern. The reason for this difference in thickness is as follows. The influence of the polymerization inhibitor on the polymerization in the saturated pattern was relatively small because the saturated pattern received a sufficient exposure dose of light. In contrast, the polymerization did not sufficiently proceed by the radical polymerization inhibitor in the semi-transmissive pattern because the semi-transmissive pattern received a smaller amount of light than the saturated pattern. As a result, the semi-transmissive pattern was smaller in size and thickness than the saturated pattern. These results lead to the conclusion that since an increased amount of the radical polymerization inhibitor reduces the thickness of the semi-transmissive pattern, the step between the two patterns can be controlled by varying the amount of the radical polymerization inhibitor in the photosensitive resin composition. Further, it can be confirmed from the results of Examples 2, 3 and 5~8 that since the radical polymerization inhibitors had different inhibitory effects on the polymerization, the steps between the two patterns were different even when the polymerization inhibitors were added in the same amounts.

The substantially greatest characteristic of the photosensitive resin composition according to the present invention is that two isolated patterns can be formed simultaneously. If there is no significant difference in thickness between the saturated pattern and the semi-transmissive pattern, it is meaningless to simultaneously form the two isolated patterns. Meanwhile, if there is such a large difference in thickness between the saturated pattern and the semi-transmissive pattern, the semi-transmissive pattern cannot perform its function to prevent light leakage when being pressed.

In view of the foregoing, the ratio of the thickness of the semi-transmissive pattern to the thickness of the saturated pattern is in the range of 0.3~0.9, preferably 0.5~0.9 and most preferably 0.6~0.85. Within this range, the patterns can be considered as being isolated from each other. Out of this range, the patterns are not suitable for use as column spacers desired in the present invention.

TABLE 1

| | | Experimental results | | | |
|---|---|---|---|---|---|
| Radical polymerization inhibitor | | Sensitivity of | Thickness of | Thickness of semi- | Thickness |
| Kind | Content (wt %) | saturated pattern (mJ/cm$^2$) | saturated pattern (μm) | transmissive pattern (μm) | difference (Å)[1] |
| Comparative Example 1 | — | — | 100 | 2.52 | 2.05 | 4,700 |
| Example 1 | MEHQ | 0.005 | 100 | 2.50 | 1.95 | 5,500 |
| Example 2 | MEHQ | 0.05 | 120 | 2.48 | 1.41 | 10,700 |
| Example 3 | TINUVIN 292 | 0.05 | 100 | 2.53 | 1.91 | 6,200 |
| Example 4 | TINUVIN 292 | 0.5 | 130 | 2.51 | 1.56 | 9,500 |
| Example 5 | BHT | 0.05 | 100 | 2.48 | 1.96 | 5,200 |
| Example 6 | 1,4-Phenylenediamine | 0.05 | 140 | 2.46 | 0.86 | 16,000 |
| Example 7 | TINUVIN 123 | 0.05 | 100 | 2.49 | 2.00 | 4,900 |
| Example 8 | Q1301 | 0.05 | 110 | 2.47 | 1.73 | 7,400 |

Note
[1] Thickness of saturated pattern - Thickness of semi-transmissive pattern In each of the spacer patterns formed in Examples 1-8, the ratio of thickness of the semi-transmissive pattern was divided by the thickness of the saturated pattern (see Table 2). The calculated values all fall within the range defined above. It will be understood that the larger the value, the smaller the difference in thickness between the saturated pattern and the semi-transmissive pattern, and vice versa.

TABLE 2

| Example No. | Thickness of saturated pattern (μm) | Thickness of semi-transmissive pattern (μm) | Ratio of thickness of the semi-transmissive pattern to the thickness of the saturated pattern |
|---|---|---|---|
| 1 | 2.50 | 1.95 | 0.78 |
| 2 | 2.48 | 1.41 | 0.57 |
| 3 | 2.53 | 1.91 | 0.75 |
| 4 | 2.51 | 1.56 | 0.62 |
| 5 | 2.48 | 1.96 | 0.79 |
| 6 | 2.46 | 0.86 | 0.35 |
| 7 | 2.49 | 2.00 | 0.80 |
| 8 | 2.47 | 1.73 | 0.79 |

As is apparent from the foregoing, the use of the photosensitive resin composition according to the present invention enables simultaneous formation of a saturated pattern and a semi-transmissive pattern as column spacer patterns having different shapes, whose difference in thickness is controllable as desired although the sensitivity is slightly reduced, through a slit or semi-transmissive mask by varying the kind and amount of the radical polymerization inhibitor. Therefore, the photosensitive resin composition of the present invention is suitable for use in the formation of column spacers and passivation materials of liquid crystal displays.

What is claimed is:

1. A photosensitive resin composition for simultaneously forming two isolated forming two isolated patterns using a half-tone mask, the photosensitive resin composition comprising at least one radical polymerization inhibitor selected from the group consisting of compounds having two or more phenolic hydroxyl groups, compounds having at least one aromatic ring substituted with at least one imino group, cyclic compounds partially substituted with at least one imino group, and hindered amine compounds; an alkali-soluble resin; an ethylenically unsaturated compound; a photoinitiator; and a solvent,
wherein the two isolated patterns are a saturated pattern and a semi-transmissive pattern, and the ratio of the thickness of the semi-transmissive pattern to the thickness of the saturated pattern is 0.3~0.9, and
wherein the radical polymerization inhibitor is present from 0.0001 to 5% by weight, based on the total weight of the photosensitive resin composition.

2. The photosensitive resin composition of claim 1, wherein the radical polymerization inhibitor is selected from the group consisting of monomethyl ether hydroquinone, bis-(1-octyloxy-2,2,6,6-tetramethyl-4-piperidinyl)sebacate, 1-(methyl)-8-(1,2,2,6,6-pentamethyl-4-piperidinyl)sebacate, aluminum-nitrosophenylhydroxylamine, butylated hydroxytoluene, phenothiazine, hydroquinone, methoxyquinone, 1,4-phenylenediamine, derivatives thereof, and mixtures thereof.

3. The photosensitive resin composition of claim 1, wherein the semi-transmissive pattern is formed through a half-tone mask including a light-transmitting portion, a semi-transmissive portion and a light-blocking portion.

4. The photosensitive resin composition of claim 3, wherein the semi-transmissive portion of the half-tone mask has an average transmittance of 4 to 25% at 300 to 450 nm.

5. The photosensitive resin composition of claim 1, wherein the composition comprises 1 to 20% by weight of the alkali-soluble resin, 1 to 20% by weight of the ethylenically unsaturated compound, 0.05 to 10% by weight of the photoinitiator, and 50 to 95% by weight of the solvent.

6. The photosensitive resin composition of claim 1, wherein the alkali-soluble resin is a copolymer of a first monomer having an acid group and a second monomer copolymerizable with the first monomer; or a polymeric compound of the copolymer and an ethylene unsaturated monomer having a copolymerizable epoxy group.

7. The photosensitive resin composition of claim 1, wherein the alkali-soluble resin has an acid value of 30 to 300 KOH mg/g and an average molecular weight of 1,000 to 200,000.

8. The photosensitive resin composition of claim 1, wherein the ethylenically unsaturated compound is selected from the group consisting of the compounds represented by Formulas 1 to 4:

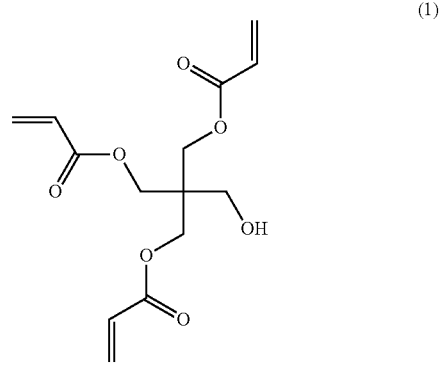

(1)

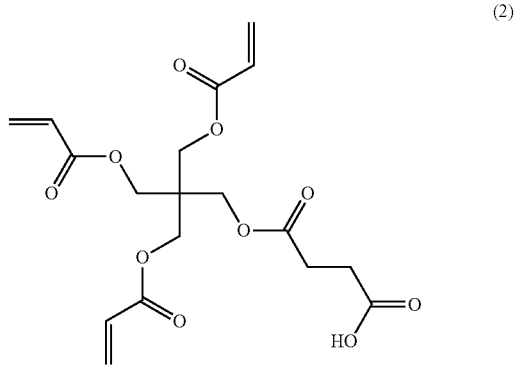

(2)

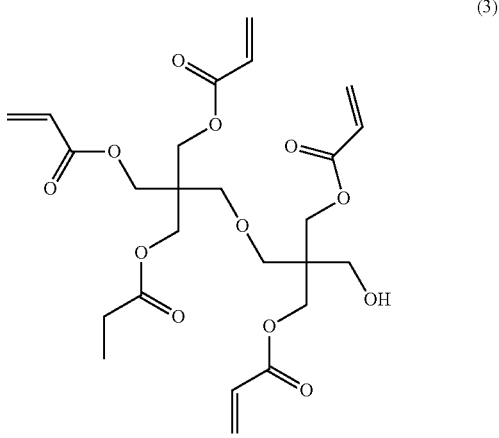

(3)

(4)

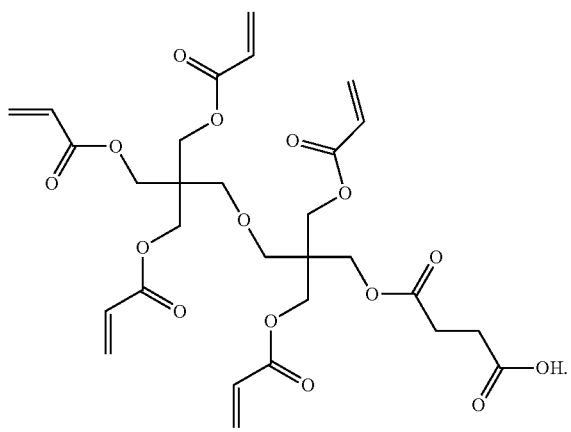

9. The photosensitive resin composition of claim 1, wherein the solvent is selected from the group consisting of methyl ethyl ketone, methyl cellosolve, ethyl cellosolve, propyl cellosolve, ethylene glycol dimethyl ether, ethylene glycol diethyl ether, ethylene glycol methyl ethyl ether, propylene glycol dimethyl ether, propylene glycol diethyl ether, propylene glycol methyl ethyl ether, 2-ethoxypropanol, 2-methoxypropanol, 3-methoxybutanol, cyclopentanone, cyclohexanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, methyl 3-methoxypropionate, and dipropylene glycol monomethyl ether.

10. The photosensitive resin composition of claim 1, wherein the two isoldated patterns are two isolated column spacer.

11. A liquid crystal display comprising the column spacer patterns formed by the photosensitive resin composition of claim 10.

* * * * *